(12) United States Patent
Elenius et al.

(10) Patent No.: US 7,057,292 B1
(45) Date of Patent: Jun. 6, 2006

(54) SOLDER BAR FOR HIGH POWER FLIP CHIPS

(75) Inventors: Peter Elenius, Scottsdale, AZ (US); Hong Yang, San Diego, CA (US)

(73) Assignee: FlipChip International, LLC, Phoenix, AZ (US)

( * ) Notice: Subject to any disclaimer, the term of this patent is extended or adjusted under 35 U.S.C. 154(b) by 0 days.

(21) Appl. No.: 09/575,298

(22) Filed: May 19, 2000

(51) Int. Cl.
*H01L 23/48* (2006.01)
*H01L 23/52* (2006.01)
*H01L 29/40* (2006.01)

(52) U.S. Cl. .................. 257/779; 257/737; 257/738; 257/778; 257/780; 257/690; 257/773

(58) Field of Classification Search ............. 257/779, 257/737, 738, 780, 778, 690, 773, 786, 767.77; 361/767, 771, 779

See application file for complete search history.

(56) References Cited

U.S. PATENT DOCUMENTS

| | | | | |
|---|---|---|---|---|
| 4,605,153 A | * | 8/1986 | Van Den Brekel et al. | 228/56.3 |
| 5,011,066 A | * | 4/1991 | Thompson | 228/180.2 |
| 5,220,200 A | | 6/1993 | Blanton | |
| 5,261,593 A | | 11/1993 | Casson et al. | |
| 5,302,854 A | * | 4/1994 | Nishiguchi et al. | 257/737 |
| 5,367,435 A | | 11/1994 | Andros et al. | |
| 5,453,582 A | * | 9/1995 | Amano et al. | 174/261 |
| 5,547,740 A | | 8/1996 | Higdon et al. | |
| 5,564,617 A | | 10/1996 | Degani et al. | |
| 5,567,648 A | * | 10/1996 | Gupta | 437/183 |
| 5,661,831 A | * | 8/1997 | Sasaki et al. | 385/49 |
| 5,796,169 A | * | 8/1998 | Dockerty et al. | 257/780 |
| 6,050,832 A | * | 4/2000 | Lee et al. | 439/91 |
| 6,091,155 A | * | 7/2000 | Jonaidi | 257/786 |
| 6,118,182 A | * | 9/2000 | Barrow | 257/773 |
| 6,239,488 B1 | | 5/2001 | Chen | |

OTHER PUBLICATIONS

Brakke, Kenneth A., Mathematics Department, Susquehanna University, Selinsgrove, PA 17870, excerpts from the Web site for "The Surface Evolver", Version 2.14, dated Aug. 18, 1999, including Surface Evolver Overview; Surface Evolver Documentation: Example: Column of Liquid Solder; Newsletter No. 2 (Feb. 26, 1993); and Newsletter No. 8 (Jun. 23, 1994).

Brandenburg, Scott and Yeh, Shing, "Electromigration Studies Of Flip Chip Bump Solder Joints", *Proceedings Surface Mount International 1998*, Sep. 1998.

\* cited by examiner

*Primary Examiner*—Eddie Lee
*Assistant Examiner*—Nitin Parekh

(57) ABSTRACT

A solder bar compatible with conventional flip chip technology fabrication methods for high power/high current applications includes first and second generally circular solder pads of diameter D formed upon a substrate and connected by a solder bar pad of width BW. The centers of the generally circular solder pads are spaced apart by distance BL (bar length). A mass of solder having volume VB is formed over the first and second generally circular solder pads and over the solder bar pad to form a dog-bone shaped solder bar. The solder bar reaches height H1 above the centers of the first and second generally circular solder pads, and reaching height H2 above the midpoint of the solder bar pad. The values for diameter D, bar length BL, bar width BW, and solder volume VB are selected in such manner that H1 and H2 are approximately equal. Conventional circular (as viewed from above) solder bumps can be formed upon the same substrate; in this case, heights H1 and H2 are made approximately equal to the height of the conventional solder bumps.

9 Claims, 5 Drawing Sheets

_US 7,057,292 B1_

SOLDER BAR FOR HIGH POWER FLIP CHIPS

BACKGROUND OF THE INVENTION

1. Field of the Invention

The present invention relates generally to flip chip integrated circuits, and more particularly, to flip chip type solder joints capable of carrying greater currents at lower current densities.

2. Description of the Relevant Art

Flip chip surface mount technology is well known in the semiconductor industry for simplifying the packaging and interconnection of integrated circuits. Typically, a series of circular (as viewed from above, or semi-spherical in three dimensions) solder bumps are formed upon the upper surface of an integrated circuit or other substrate in electrical contact with active or passive devices formed upon such substrate. Such solder bumps are then aligned with pads formed upon a second substrate to which the first substrate is to be mounted. The use of solder bumps to interconnect such flip chip integrated circuits to underlying support substrates is disclosed, for example, within U.S. Pat. No. 5,261,593 to Casson, et al.; within U.S. Pat. No. 5,220,200 to Blanton; within U.S. Pat. No. 5,547,740 to Higdon, et al.; and within U.S. Pat. No. 5,564,617 to Degani,et al.

However, the need for conducting relatively high currents, particularly power and ground interconnections, through such solder bumps in high power applications poses a problem relating to solder and UBM (Under Bump Metal) electromigration, which can in turn present functional and reliability issues during the device operating life. Electromigration results in a separation of the elements of the solder joint and/or preferential movement of the UBM intermetallics through the solder joint. Typical flip chip solder bumps can experience early failures due to electromigration when exposed to a high current density at a given junction temperature.

When a current is applied through a solder interconnect, the potential exists for a segregation of the elements due to electromigration. An example of a 63Sn/37Pb flip chip solder bump in which electromigration has occurred is shown in the cross-sectional enlarged photograph of FIG. 1; incidentally, the gap present between the silicon chip 20 and layer 22 labeled "Sn" is simply material that fell out during the cross sectioning process. In FIG. 1, the direction of the electron flow is from the silicon chip 20 to the copper pad 24 on the printed circuit board substrate 26. Typically, the worst electromigration is seen with this direction of electron flow, since the via on the silicon chip is smaller than the printed circuit board solder pad, and hence, the current density is highest at the silicon chip via It may be seen in FIG. 1 that the Pb component (i.e., the darker-colored material 23) has completely migrated from a uniform distribution to a localized area on the top of the printed circuit board pad.

The critical factors for electromigration of flip chip solder bumps are (1) the solder bump temperature; (2) the via cross-sectional area; and (3) the current per bump. It is known that Pb migrates preferentially at temperatures greater than 125° C. It has also been observed that Sn migrates preferentially at near room temperature.

One method of reducing current density in flip chip circuits is to use two or more solder bumps to form parallel current-conducting paths. However, in a given flip chip design, there is typically a limited amount of area in which to position the solder bumps, even in a full-array type design. There are limits as to how close together such solder bumps can be arranged to avoid the violation of processing design rules, and the use of two or more solder bumps to form parallel connections is not a very effective use of the limited area available in which to make all necessary electrical interconnections. Another method of handling large currents is to use wire bonds instead of solder bumps, but this approach is not cost effective; it tends to increase the size of the integrated circuit die, and may not meet the inductance requirements of the application.

Accordingly, it is an object of the present invention to provide a relatively compact solder joint configuration which is compatible with conventional flip chip processing techniques and which effectively increases the cross-sectional area of the solder joint, thereby reducing current density, providing higher current-handling capacity, and improving device operating life, as compared with conventional flip chip solder bumps.

It is another object of the present invention to provide such a solder joint configuration that can be formed upon the same substrate as conventional solder bumps.

Still another object of the present invention is to provide such a solder joint configuration that has a relatively uniform height.

Yet another object of the present invention is to provide such a solder joint configuration wherein the height thereof is approximately equal to the height of a conventional solder bump formed upon the same substrate.

A further object of the present invention is to provide a method for selecting the dimensions of such a solder joint configuration in order to minimize variations in the height of such solder joint configuration.

These and other objects of the present invention will become more apparent to those skilled in the art as the description thereof proceeds.

SUMMARY OF THE INVENTION

Briefly described, and in accordance with a preferred embodiment thereof, the present invention is a solder bar formed upon the upper surface of a flip chip integrated circuit or other "first substrate". The solder bar of the present invention is adapted to join a first electrical contact on the first substrate to a second electrical contact on a second substrate. This solder bar replaces one or more discrete solder bumps to effectively increase the cross-sectional area of the solder interconnect, thereby reducing the current density in the solder. The solder bar includes first and second generally circular solder pads that are formed upon the upper surface of the first substrate; these solder pads may be patterned "under bump metal" (UBM) layers. Each of the first and second generally circular solder pads has a predetermined diameter D, and the centers of such first and second generally circular solder pads are spaced apart from each other by a spacing distance, or bar length, BL. A solder bar pad is also formed upon the upper surface of the first substrate having a bar width BW and connecting the first and second generally circular solder pads to each other said second circular solder pad; bar width BW is less than the diameter D of the first and second generally circular solder pads.

The solder bar also includes a mass of solder having a volume VB formed over the first and second generally circular solder pads and over the solder bar pad. The solder bar reaches a height H1 above each of the centers the first and second generally circular solder pads, and reaches a height H2 above a midpoint of the solder bar pad. The values of diameter D, bar length BL, bar width BW, and solder bar volume VB are selected in such a manner that heights H1 and H2 are approximately equal to each other, thereby providing a solder joint of relatively uniform height. In this regard, any difference between height H2 and height H1 should be less than 100% of height H2, and preferably less than 5% of height H2.

As mentioned above, the aforementioned solder bar may advantageously be employed upon the same substrate on which conventional solder bumps are formed. If such conventional solder bumps are formed having a height H3, then it is preferred that height H1 and height H2 of the solder bar are approximately equal to height H3. If such conventional solder bumps have a solder pad diameter Dc, then the diameter D of the first and second generally circular solder pads of the solder bar is preferably in the range of from substantially Dc to substantially 2 times Dc. If such conventional solder bumps have a solder bump volume Vc, then the solder bar volume VB is preferably in the range of from substantially 2 times Vc to substantially 5 times Vc.

The present invention also relates to a method of forming a raised solder mass used to electrically interconnect a first substrate, such as a flip chip integrated circuit, to a second substrate order to reduce current density of current flowing within such raised solder mass. This method includes the steps of providing a first substrate having an electrical contact upon an upper surface thereof, and forming a solder bar upon the upper surface of said first substrate electrically-coupled to such electrical contact for joining the same to a second electrical contact on a second substrate. In forming such solder bar, one first forms first and second generally circular solder pads, each of a predetermined diameter D, upon the first substrate. The centers of the first and second generally circular solder pads are spaced from each other by a spacing distance, or bar length, BL. A bar pad is formed having a predetermined bar width BW upon the first substrate connecting the first and second generally circular solder pads to each other; bar width BW is less than predetermined diameter D. A predetermined solder bar volume VB is formed over the first and second generally circular solder pads and over the bar pad; solder bar volume VB reaches a height H1 above the centers of the first and second generally circular solder pads, and reaches a height H2 above the midpoint of the bar pad. The parameters diameter D, bar length BL, bar width BW, and solder bar volume VB are selected in such manner that H1 and H2 are approximately equal to each other to provide a solder bar of relatively uniform height.

The aforementioned method can include the additional step of forming conventional generally circular (as viewed from above) solder bumps, each having a height H3, upon the first substrate; in this event, the present method is preferably practiced in such a manner that height H1 and height H2 of the solder bar are approximately equal to height H3.

Assuming that conventional generally circular (as viewed from above) solder bumps are formed upon the first substrate, and that such conventional generally circular solder bumps have a solder pad diameter Dc, then the diameter D of the first and second generally circular solder pads of the solder bar is preferably selected to be in the range of from substantially Dc to substantially 2 times Dc.

Assuming that conventional generally circular (as viewed from above) solder bumps are formed upon the first substrate, and that such conventional generally circular solder bumps have a solder bump volume Vc, then the solder bar volume VB is preferably selected to be in the range of from substantially 2 times Vc to substantially 5 times Vc.

In order to select the proper values for solder bar volume VB, bar length BL, bar width BW, and diameter D, computer software that implements a regression algorithm can be used to iteratively compute proper values. For example, one may start by pre-selecting values for solder bar volume VB, bar length BL, and bar width BW; next, an initial value for diameter D is selected, and resulting values for H1 and H2 are computed using the computer model based upon the preselected values for VB, BL, BW, and the initial value for D. If the computer model shows that H1 is greater than H2, then diameter D is reduced, whereas if H1 is less than H2, then diameter D is increased. The computer model is then run again in an iterative process until the computed values of H1 and H2 become approximately equal to each other. The resulting value for diameter D is then used to form the first and second generally circular solder pads of the solder bar. Again, this method is preferably practiced such that any difference between height H2 and height H1 is less than 10% of height H2; ideally, the difference between height R2 and height H1 is less than 5% of height H2.

Alternatively, the method described in the preceding paragraph can be practiced by pre-selecting a different combination of parameters, such as diameter D, bar length BL, and bar width BW, and computing the value for solder bar Volume VB using a similar iterative process within the computer software model.

DETAILED DESCRIPTION OF THE PREFERRED EMBODIMENT

Figure 1:
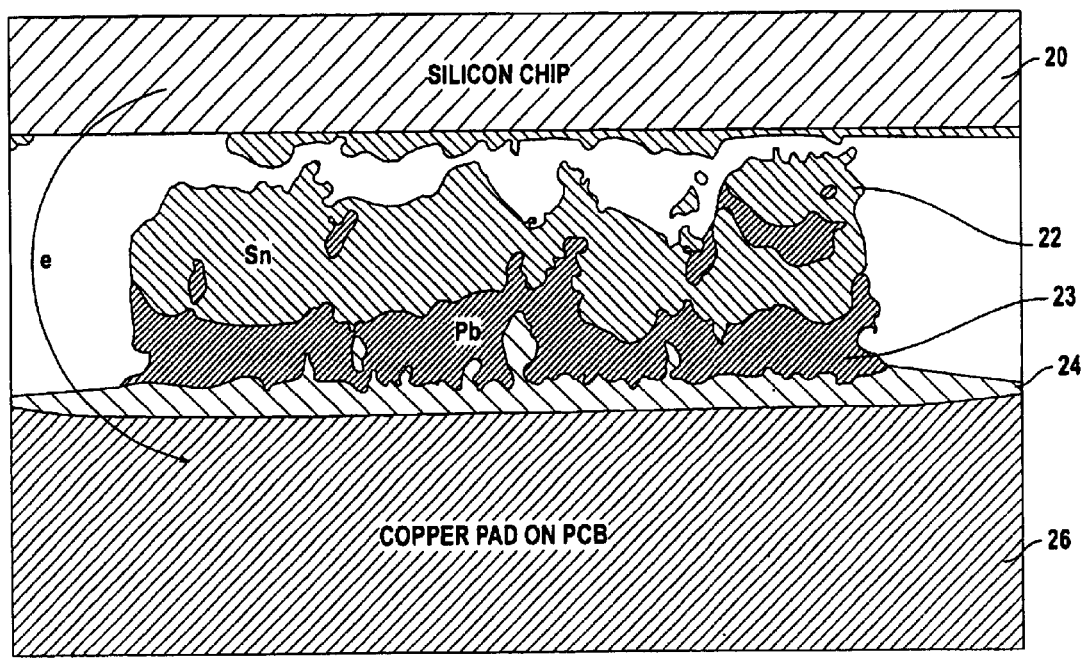
FIG. 1 is an enlarged photograph of a cross-section of a solder bump in which electromigration has caused a separation of the Sn and Pb components of the solder.
Figure 2:
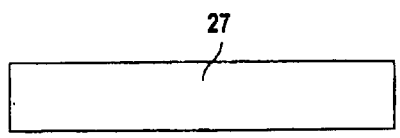
FIG. 2 shows a non-optimal rectangular configuration for a solder bar.
Figure 3:
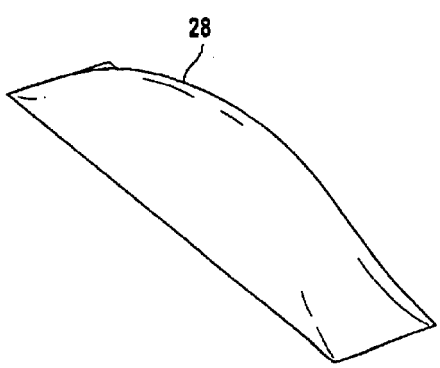
FIG. 3 is a three-dimensional graphic model of the solder bar resulting from the selection of the non-optimal rectangular configuration shown in FIG. 2.

Before describing the preferred embodiment of the present invention, it may be helpful to first consider a very basic, non-optimal structure for a solder bar. A simple rectangular UBM (Under Bump Metal) structure 27 for a solder bar is shown in FIG. 2. In order to predict the results of using such a configuration, a computer software model was used. One such computer model known by the name "Surface Evolver" is available from the University of Minnesota Geometry Center, and can be downloaded over the Internet via a Web page having the domain name "http://geom.umn.edu/software/download/evolver.html". Using the rectangular layout shown in FIG. 2, and based upon the selection of a particular solder bar volume VB, the Surface Evolver computer model results in a non-optimal solder bar profile 28 shown in FIG. 3. This simple solder bar structure does not achieve the desired results, as the height of solder bar 28 is continuously changing over its length. When this type of solder bar is assembled into a flip chip structure, the potential for assembly defects will be high, assuming that solder bar 28 is attached to a solder pad (not shown) on a printed circuit board (or other second substrate) of approximately the same size and configuration as the UBM (see FIG. 2) used to form solder bar 28.

Figure 4:
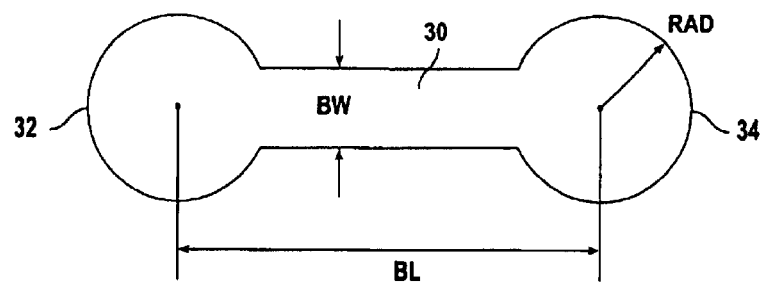
FIG. 4 shows the basic layout and dimensions of the under bump metallization (UBM layer) for a solder bar configured in accordance with the present invention.

The Surface Evolver computer model was used in conjunction with experimental results to successfully design and evaluate a number of options in Under Bump Metallurgy (UBM) dimensions and solder volumes for solder bars. In order to create a more optimal solder bar, the simple solder bar UBM configuration shown in FIG. 2 was modified with additional features to achieve a more uniform solder profile. As shown in FIG. 4, a UBM structure for a solder bar was modeled that consists of a rectangular section 30 extending between a first circular solder pad 32 and a second circular solder pad 34, forming a dog-bone shape. Incidentally, the terms circular and generally circular are used throughout this specification, and also within the following claims; those skilled in the art will appreciate that the ends of the solder bar structure need not be entirely circular, and that hexagons, octagons, other polygonal shapes, ovals, and other generally circular shapes may also be used to approximate a circle; the term "generally circular" is intended to include such alternate shapes. Within FIG. 4, the aforementioned dimensions diameter D (two times radius Rad), bar width BW, and bar length BL, are shown.

The parameters used in the modeling of the solder bar configuration shown in FIG. 4 are:

BW—the width of the rectangular section 30 between the circular pads 32 and 34;

BL—the distance between the centers of circular pads 32 and 34;

Rad—the radius of circular pads 32 or 34 (one-half the corresponding diameter D); and VB—the volume of solder applied to the solder bar structure.

An optimal solder bar has approximately the same height H1 when measured above the center of circles 32 and 34 as the height H2 at the middle of the bar. Thus, the values for H1 and H2 are defined as follows:

H1—Height of solder at center of each circle

H2—Height of the solder at the mid-point of the solder bar

A flatness rating for the solder bar is defined as (H2−H1)/H2; an ideal flatness rating would be zero wherein H2 and H1 are identical. This flatness rating should be 10% or less, and is preferably 5% or less to achieve reasonable uniformity of the height of the solder bar.

Figure 5:
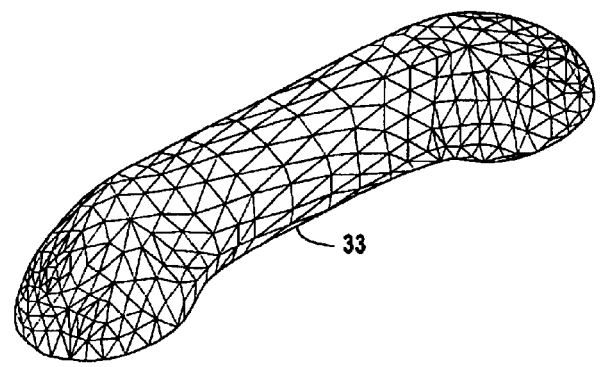
FIG. 5 is a three-dimensional graphic model of the solder bar resulting from the basic layout shown in FIG. 4 under optimal conditions wherein the height of the solder bar is relatively uniform along its length.
Figure 6:
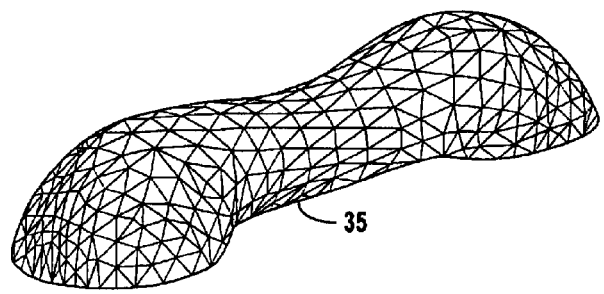
FIG. 6 is a three-dimensional graphic model of the solder bar resulting from the basic layout shown in FIG. 4, but wherein the height H1 above the centers of the generally circular solder pads is greater than the height H2 at the midpoint of the solder bar.
Figure 7:
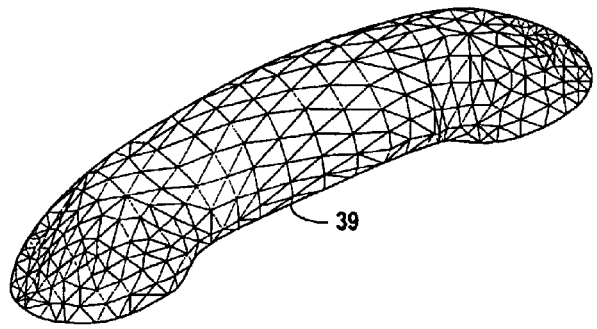
FIG. 7 is a three-dimensional graphic model of the solder bar resulting from the basic layout shown in FIG. 4, but wherein the height H1 above the centers of the generally circular solder pads is less than the height R2 at the midpoint of the solder bar.

FIG. 5 is a graphical image plotted by the Surface Evolver computer model for a relatively optimal solder bar 33 having the basic UBM configuration shown in FIG. 4. For the optimal solder bar shown in FIG. 5, the flatness rating achieved was less than 5%. For purposes of comparison, two non-optimal cases are shown in FIG. 6 and FIG. 7. In FIG. 6, the radius Rad (and hence, the diameter D) of the circular end portions has been made too large, resulting in H1>H2, and the solder bar 35 taking on a saddle-back type structure. In FIG. 7, the radius Rad (and hence, the diameter D) of the circles is too small, resulting in H1<H2, and the solder bar 39 taking on a mounded shape. While the solder bar 39 shown in FIG. 7 is more uniform than that achieved with the simple non-optimal bar shown in FIG. 3, it is not sufficiently flat to be considered an optimal solder bar.

Figure 8:
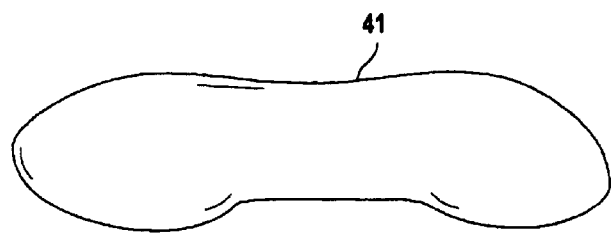
FIG. 8 is a scanning electron microscope image of an actual near optimal solder bar constructed by applicants.

A scanning electron microscope image of an actual near-optimal solder bar 41 formed by applicants is shown in FIG. 8. This solder bar has a flatness rating of approximately 15%, with height H2 at the center of the solder bar being slightly less than height H1 above the centers of the circular end portions.

In practicing the method of the present invention, a regression algorithm is preferably used in conjunction with the Surface Evolver modeling software to obtain an optimized solder bar profile. Any of the four variables, bar width BW, bar length BL, diameter D, or solder bar volume VB, can be modified to obtain the optimal profile. The example described below fixes, or pre-selects, all variables except for the diameter D (or radius Rad) of the circular end portions of the solder bar. The response variables examined are the heights H1 and H2, described previously.

Figure 9:
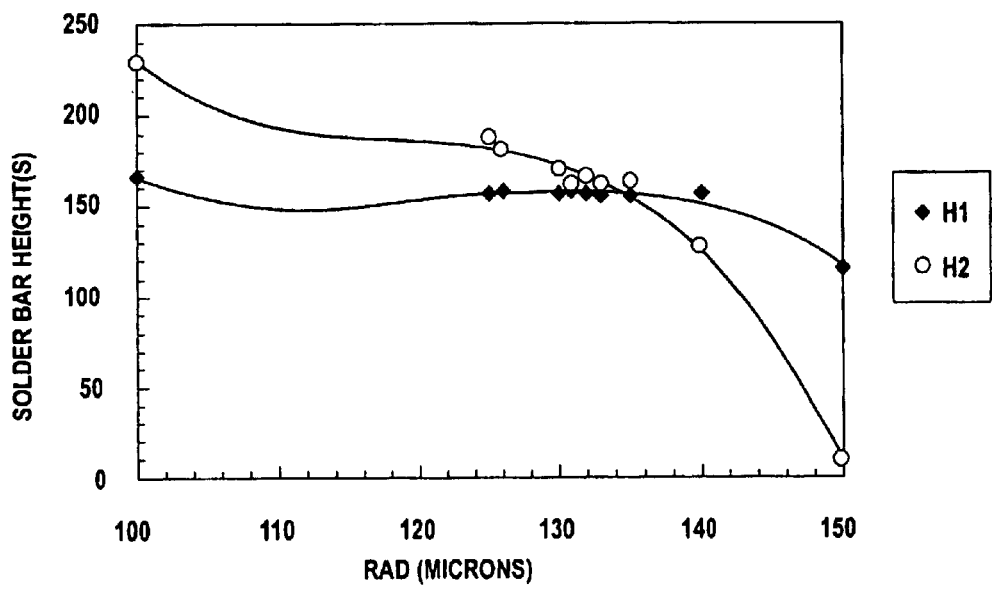
FIG. 9 is a graph showing the results of a computer model used to plot computed values of heights H1 and R2 relative to varying values for the radius of the generally circular solder pads of the solder bar.

For the case modeled in FIG. 9, the values for the parameters held fixed were:

BW—80 microns

BL—400 microns

VB—$2 \times 10^{-5}$ cm.

It is seen in FIG. 9 that, as the radius Rad is varied from 100 to 150 microns, H2 (height of the center of the solder bar) varies from 230 to 10 microns. Over this same range, H1 (the height of the end circles) varies from 165 to 115 microns. The flatness rating (H2−H1)/H2 meets the 10% or less criteria when the radius of the circles is in the range of 128 through 138 microns. If the radius of the circles is constrained to the range of 131 to 135 microns, the flatness rating is 5% or less.

Figure 10:
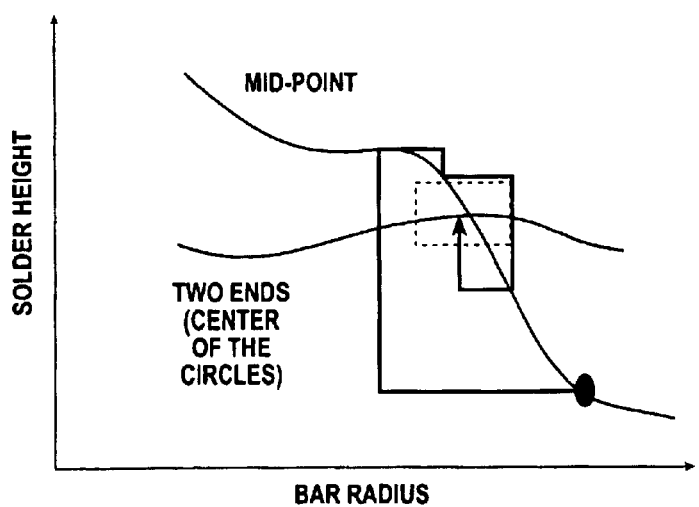
FIG. 10 is a graphical representation of a regression algorithm used in conjunction with such computer model to iterate toward a preferred value for the radius of the generally circular solder pads of the solder bar.

To arrive at the optimal solder bar dimensions, the following regression algorithm is used:
1. For a fixed VB, BW and BL, select a Rad value ($Rad_1$) to start the simulation, and calculate the solder bar heights $H1_1$ and $H2_1$;
2. If $H1_i > H2_i$ (where i=1, 2, 3, ... n), reduce the $Rad_i$ to $Rad_{i+1}$, rerun the simulation, and calculate the next height values $H1_{i+1}$ and $H2_{i+1}$. Further reduce $Rad_{i+1}$, if necessary until a reversed trend is found (i.e., $H1_{i+1} < H2_{i+1}$).
3. Once such a trend reversal is detected, compute an averaged value for Rad based upon the two previous values for Rad, i.e., use $Rad_{i+2} = (Rad_{i+1} + Rad_i)/2$, and calculate $H1_{i+2}$ and $H2_{i+2}$.
4. If $H1_{i+2} = H2_{i+2}$, then stop the simulation, and the desired Rad value has now been determined ($Rad_{i+2}$); otherwise go back to step 2.
5. A set of parameters is now determined for the solder bar structure at a given solder bar volume VB A graphical representation oft he regression algorithm described above is shown in FIG. 10.

A technical challenge necessary to meet the requirements of most applications is to incorporate the relatively large solder bar structure in the internal active areas of the device, while providing conventional flip chip solder bumps on the periphery. The described solder bars can advantageously be used for the higher-current power and ground portions of the interconnect, while the conventional flip chip solder bumps can still be used for the control and interface interconnections. In such instances, it is highly desirable to maintain the same solder bar height and solder bump height to facilitate the assembly of the device in a mixed solder bar and bump design. This objective assures a uniform fluxing of the solder interconnects, as well as a higher-yielding assembly process. Most flip chip fluxing techniques utilize a dip flux process that coats the solder bumps with 35–50 microns of flux. Most assembly processes can also tolerate a bump height deviation in the range of +/−20 microns; preferably, the bump height deviation is maintained within the range of +/−12 microns.

Figure 11:
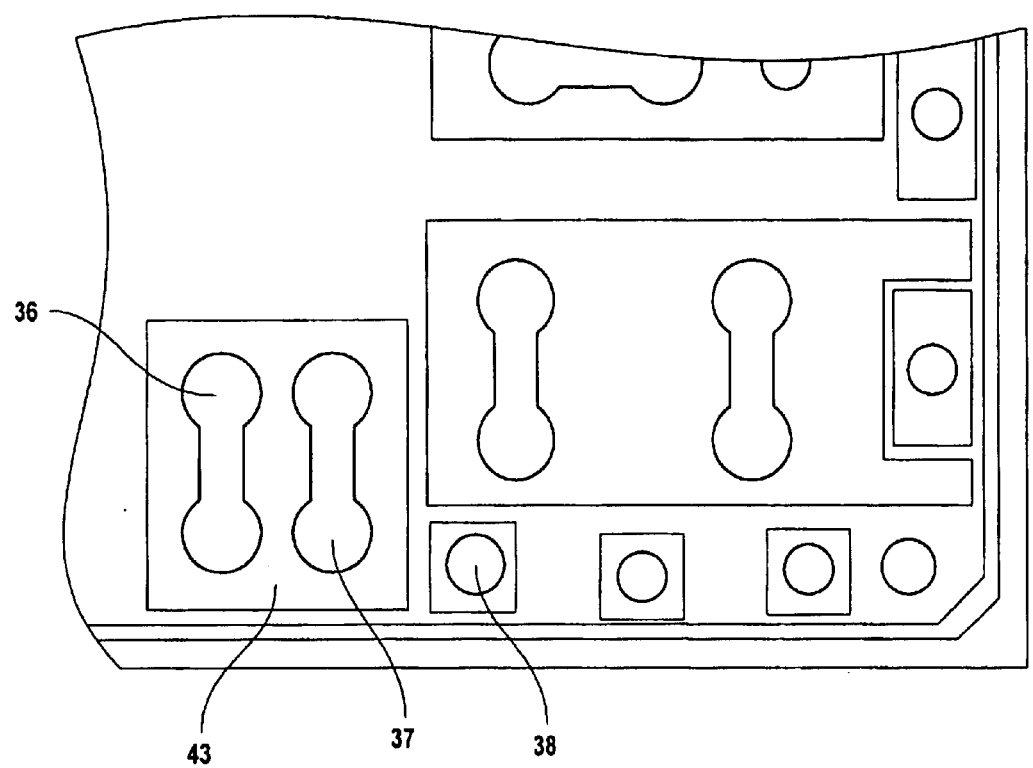
FIG. 11 is an enlarged photograph of a portion of an integrated circuit having both conventional circular (as viewed from above) solder bumps as well as solder bars constructed in accordance with the present invention.
Figure 12:
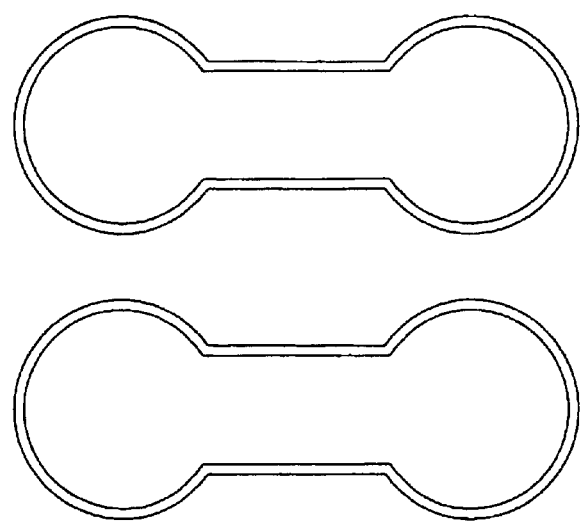
FIG. 12 is an enlarged photograph of the under-bump metallization (JBM layer) for two solder bars constructed in accordance with the present invention.

The solder bar technique described herein has been successfully applied to an actual flip chip integrated circuit. In this design, a continuous current of 3 amps had to be carried on several of the vias. It was not possible to get an adequate number of standard solder bumps to fit in the allowable area, so the present solder bar technique was used instead. The application also required a number of inputs and outputs that needed to utilize a standard solder bump. One of the challenges in this design was obtaining a consistent height between the flip chip solder bumps and the solder bars. A view of a portion of this chip is shown in FIG. 11, wherein two solder bars identified by reference numerals 36 and 37 are formed on a large wire bond pad 43, and a conventional solder bump is identified by reference numeral 38. After the UBM deposition and patterning, the two solder bars on the large wire bond pad appear as shown in FIG. 12. The outer line 40 of the "barbell" or "dog-bone" shape is the patterned UBM, while the inner line 42 is the passivation opening in the SiN passivation layer to the underlying final metal bond pad 43.

Figure 13:
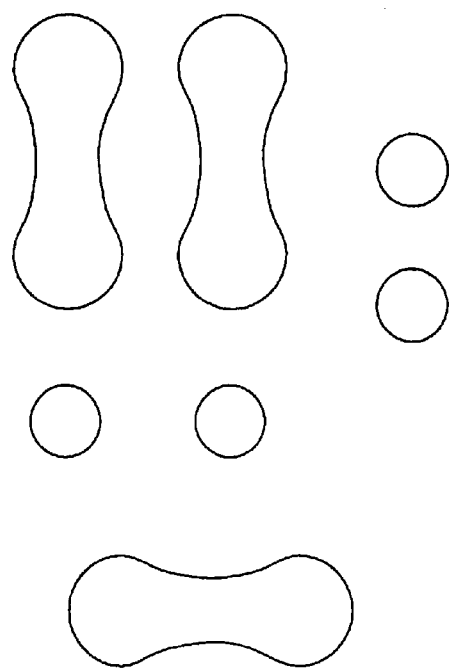
FIG. 13 is an enlarged photograph of a substrate upon which has been formed both conventional "circular" solder bumps as well as solder bars of the type described herein.
Figure 14:
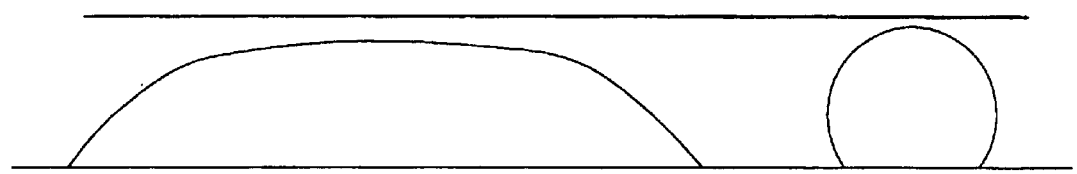
FIG. 14 is an enlarged photograph of a cross-section of a substrate upon which has been formed both a conventional circular solder bump as well as a solder bar of the type described herein.

A top view of the solder bar and solder bumps formed on a target wafer is shown in FIG. 13. It is seen that both the solder bars and conventional solder bumps are well formed. The bright surfaces at both the top of the bumps and the top of the solder bars indicate that the surfaces are at approximately the same height. The top surface of the solder bar is planar over a distance of 330 microns as measured and written on the lower solder bar. As previously described, it is desirable that, for mixed solder bars and solder bumps, the two structures have the same or similar heights. In FIG. 14, a cross section of a solder bar 44 and solder bump 46 is shown. A reference line 48 is also shown in FIG. 14. When comparing solder bar 44 and solder bump 46 to the reference line, it is seen that they are approximately the same height. The actual measurement for this case was approximately a 10 micron delta between the height of solder bar 44 and the height of solder bump 46. While adequate for flip chip assembly of this device, additional optimization could be done for the solder deposition parameters for either the solder bar or solder bump to further reduce this nominal variation in height.

Referring again to FIG. 12, the large wire bond pad 43 measures approximately 675×675 microns. To maintain a common solder bump size for the chip, a conventional solder bump with a 150 micron UBM diameter is required. If a 150 micron UBM solder bump is used on the large wire bond pad 35, a maximum of 4 such bumps could be placed on the pad in a 300×300 micron array. Following the solder bump design rules used by the assignee of the present invention, the maximum via size that could be used would be 130 microns. Therefore, for the four solder bumps, the cross sectional area of the vias would collectively be 53,100 $micron^2$.

The solder bars used in the design shown in FIGS. 11 and 12 have circle diameters D of 230 microns, a bar width BW of 135 microns and a pitch or bar length BL between the circular portions of 375 microns. This results in a cross sectional area for the via in each bar of 85,950 $micron^2$, or a total of 171,900 $micron^2$ for the two solder bars. Thus, the use of the two solder bars 36 and 37 represents an increase of via cross sectional area of 3.2 times that possible using four standard solder bumps as described above.

If the requirement for this pad is to have a continuous current of 3 amps at 115° C. average bump temperature, then the modeled mean time to failure (MTTF) is 2,932 hours for the case of the four conventional flip chip solder bumps, in accordance with Brandenburg, Scott, et al., "Electromigration Studies of Flip Chip Solder Joints," *Proceedings Surface Mount International* 1998, San Jose, Calif., September 1998. In the case of the solder bars 36 and 37 of FIGS. 11 and 12 described above, and for the same conditions, the modeled MTTF is 24,900 hours, or an increase of 8.5 times that of the case of the four conventional solder bumps. This significant increase in reliability is due to current density being reduced from 5,650 $amps/cm^2$ for the solder bump case to 1,700 $amps/cm^2$ for the solder bars.

Figure 15:
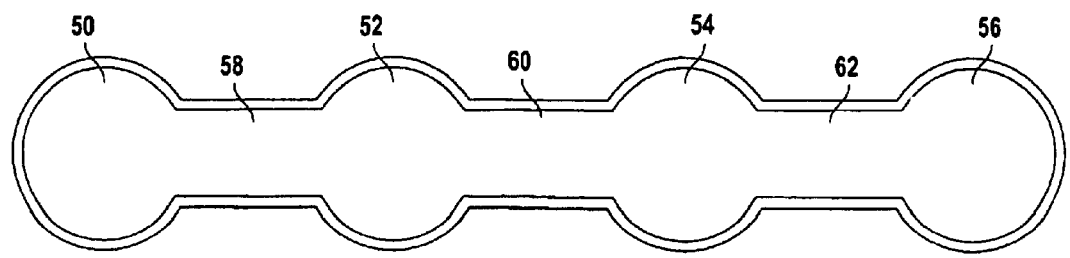
FIG. 15 illustrates an alternate embodiment of the present invention in the form of an elongated solder bar having multiple circular UBM pads spaced along the length of the solder bar.

FIG. 15 illustrates the under-bump metallization (UBM layer) for an alternate embodiment of the present invention wherein an elongated solder bar is formed by providing a series of three or more circular UBM pads spaced along the length of the solder bar, and wherein adjacent circular pads are interconnected by uniform width connecting rectangular bars. Within FIG. 15, four circular UBM pads 50, 52, 54 and 56 are arranged along a longitudinal axis in co-linear fashion. Circular UBM pads 50 and 52 are interconnected by rectangular bar 58; circular UBM pads 52 and 54 are interconnected by rectangular bar 60; and circular UBM pads 54 and 56 are interconnected by rectangular bar 62. This technique can be used to form relatively long (i.e., 3 mm. or more) solder bars, as might be used for power and ground interconnects to a substrate. The method of modeling such structures is similar to that already described above in conjunction with FIG. 4, except that the Surface Evolver model is somewhat more complicated due to the more complex shape of the structure being modeled. The model is again run through an iterative process until the height of the solder bar intermediate adjacent circular pads is approximately equal to the height of the solder bar above the center of each circular pad.

Those skilled in the art will now appreciate that a solder bar configuration, and a method of forming such a solder bar, have been described which provide a relatively compact solder joint configuration that is compatible with conventional flip chip processing techniques and which effectively increases the cross-sectional area of the solder joint as compared with conventional flip chip solder bumps. These solder bars reduce current density, allow for higher current-handling capacity, and improve device operating life, as compared with conventional flip chip solder bumps. It will also be appreciated that such solder bars can be formed upon the same substrate as conventional solder bumps. Those skilled in the art will also appreciate that the present specification discloses a method of designing such solder bars, by adjusting the key parameters (D, BL, BW, and VB), to have a relatively uniform height, and that such height can be selected to be approximately equal to the height of a conventional solder bump formed upon the same substrate. This same height capability allows for a high yielding flip chip assembly process of high power devices. While the present invention has been described with respect to a preferred embodiment thereof, such description is for illustrative purposes only, and is not to be construed as limiting the scope of the invention. For example, while the present invention has been described with respect to flip chip integrated circuits, it may be applied to other microelectronics structures, such as solder sealing rings and solder interconnects for chip scale packages (CSPs) and ball grid arrays (BGAs). Various modifications and changes may be made to the described embodiment by those skilled in the art without departing from the true spirit and scope of the invention as defined by the appended claims.

We claim:

1. A reflowable solder bar formed upon an upper surface of a first substrate, the first substrate having a first electrical contact, said reflowable solder bar being adapted to join the first electrical contact to a second electrical contact on a second substrate, said reflowable solder bar comprising in combination:
   a. a first generally circular solder pad formed upon the upper surface of the first substrate, the first generally circular solder pad having a center, and having a first predetermined diameter D;
   b. a second generally circular solder pad formed upon the upper surface of the first substrate, the second generally circular solder pad having a center, and having said first predetermined diameter D, the center of said second generally circular solder pad being spaced from the center of said first generally circular solder pad by a predetermined spacing distance BL;
   c. a solder bar pad of a first predetermined bar width BW formed upon the upper surface of the first substrate connecting said first circular solder pad to said second circular solder pad, the first predetermined bar width BW being less than the first predetermined diameter D;
   d. a mass of tin/lead eutectic composition solder having a solder bar volume VB formed over the first and second generally circular solder pads and over said solder bar pad to form said reflowable solder bar, the solder bar volume VB reaching a height H1 above the centers of said first and second generally circular solder pads, and reaching a height H2 above a midpoint of said solder bar pad, the mass of tin/lead eutectic composition solder having a lowermost base region adjacent said solder bar pad, the width of the lower most base region of the solder mass along the solder bar pad being substantially equal to solder bar pad width BW;
   e. wherein the values for predetermined diameter D, spacing distance BL, predetermined bar width BW, and solder bar volume VB are selected in such manner that H1 and H2 are approximately equal.

2. The reflowable solder bar recited by claim 1 wherein conventional generally circular (as viewed from above) solder bumps are also formed upon the upper surface of the first substrate, the conventional generally circular solder bumps having a height H3, and wherein height H1 and height H2 of said solder bar are approximately equal to height H3.

3. The reflowable solder bar recited by claim 2 wherein the conventional generally circular solder bumps have a particular solder pad diameter Dc, and wherein the diameter D of said first and second generally circular solder pads of said solder bar is in the range of from substantially DC to substantially 2 times Dc.

4. The reflowable solder bar recited by claim 2 wherein the conventional generally circular solder bumps have a particular solder bump volume Vc, and wherein the solder bar volume VB is in the range of from substantially 2 times Vc to substantially 5 times Vc.

5. The reflowable solder bar recited by claim 1 wherein said first substrate is a flip-chip integrated circuit.

6. The reflowable solder bar recited by claim 1 wherein any difference between height H2 and height H1 is less than 10% of height H2.

7. The reflowable solder bar recited by claim 1 wherein any difference between height H2 and height H1 is less than 5% of height H2.

8. A reflowable solder bar formed upon an upper surface of a first substrate, the first substrate having a first electrical contact, said reflowable solder bar being adapted to join the first electrical contact to a second electrical contact on a second substrate, said reflowable solder bar comprising in combination:
   a. a first generally circular solder pad formed upon the upper surface of the first substrate, the first generally circular solder pad having a center, and having a first predetermined diameter D;
   b. a second generally circular solder pad formed upon the upper surface of the first substrate, the second generally circular solder pad having a center, and having said first predetermined diameter D, the center of said second generally circular solder pad being spaced from the center of said first generally circular solder pad by a predetermined spacing distance BL;
   c. a solder bar pad of a first predetermined bar width BW formed upon the upper surface of the first substrate connecting said first circular solder pad to said second circular solder pad, the first predetermined bar width BW being less than the first predetermined diameter D;
   d. a mass of reflowable solder having a solder bar volume VB formed over the first and second generally circular solder pads and over said solder bar pad to form said reflowable solder bar, the solder bar volume VB reaching a height H1 above the centers of said first and second generally circular solder pads, and reaching a height H2 above a midpoint of said solder bar pad, the mass of reflowable solder having a lowermost base region adjacent said solder bar pad, the width of the lower most base region of the solder mass along the solder bar pad being substantially equal to solder bar pad width BW;
   e. wherein the values for predetermined diameter D, spacing distance BL, predetermined bar width BW, and solder bar volume VB are selected in such manner that H1 and H2 are approximately equal.

9. The reflowable solder bar recited by claim 8 wherein said mass of reflowable solder comprises eutectic composition solder.

* * * * *